(12) United States Patent
Knoedgen

(10) Patent No.: US 9,313,836 B2
(45) Date of Patent: *Apr. 12, 2016

(54) CIRCUIT AND METHOD FOR DETECTING THE DURATION OF THE INTERRUPTION OF A MAINS INPUT

(71) Applicant: Dialog Semiconductor GmbH, Kirchheim/Teck-Nabern (DE)

(72) Inventor: Horst Knoedgen, Munich (DE)

(73) Assignee: Dialog Semiconductor GmbH, Kirchheim/Tech-Nabern (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/575,192

(22) Filed: Dec. 18, 2014

(65) Prior Publication Data

US 2015/0102740 A1    Apr. 16, 2015

Related U.S. Application Data

(63) Continuation of application No. 14/043,965, filed on Oct. 2, 2013, now Pat. No. 8,922,139.

(30) Foreign Application Priority Data

Dec. 18, 2012   (EP) ..................................... 12197792

(51) Int. Cl.
*H05B 37/02*   (2006.01)
*H05B 39/04*   (2006.01)
*H05B 41/36*   (2006.01)
*H05B 33/08*   (2006.01)
*G01R 31/00*   (2006.01)
*F21K 99/00*   (2010.01)

(52) U.S. Cl.
CPC ................ *H05B 33/08* (2013.01); *F21K 9/135* (2013.01); *G01R 31/00* (2013.01); *H05B 33/0842* (2013.01); *H05B 33/0848* (2013.01); *H05B 37/02* (2013.01)

(58) Field of Classification Search
None
See application file for complete search history.

(56) References Cited

U.S. PATENT DOCUMENTS

| 8,922,139 B2 * | 12/2014 | Knoedgen ..................... 315/360 |
| 2009/0058195 A1 | 3/2009 | Tsai et al. |
| 2009/0322255 A1 | 12/2009 | Lin |
| 2011/0109249 A1 | 5/2011 | Liu et al. |
| 2012/0139446 A1 | 6/2012 | Koren et al. |

* cited by examiner

*Primary Examiner* — Anh Tran
(74) *Attorney, Agent, or Firm* — Saile Ackerman LLC; Stephen B. Ackerman; Rosemary L. S. Pike

(57) ABSTRACT

A light bulb assembly comprises an electrical connection module, a driver circuit configured to provide electrical energy at a drive voltage, and a light source. The driver circuit converts electrical energy at an input voltage to the electrical energy at the drive voltage. A controller is configured to control the power converter to provide electrical energy at the drive voltage. The controller stops operation at an interruption of electrical energy to the driver circuit. The controller is configured to resume operation subsequent restoration of electrical energy to the driver circuit. The controller is configured to maintain the timing voltage above a first voltage level when the controller is in operation and to determine the duration of an interruption of electrical energy to the driver circuit.

16 Claims, 6 Drawing Sheets

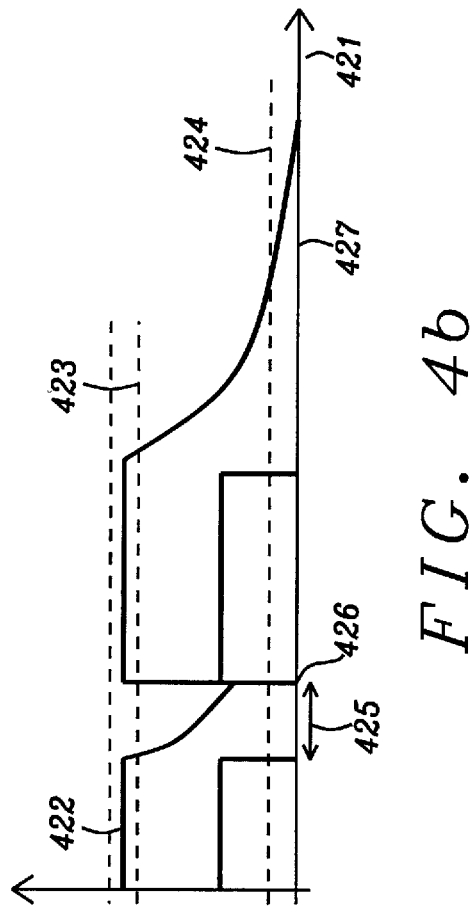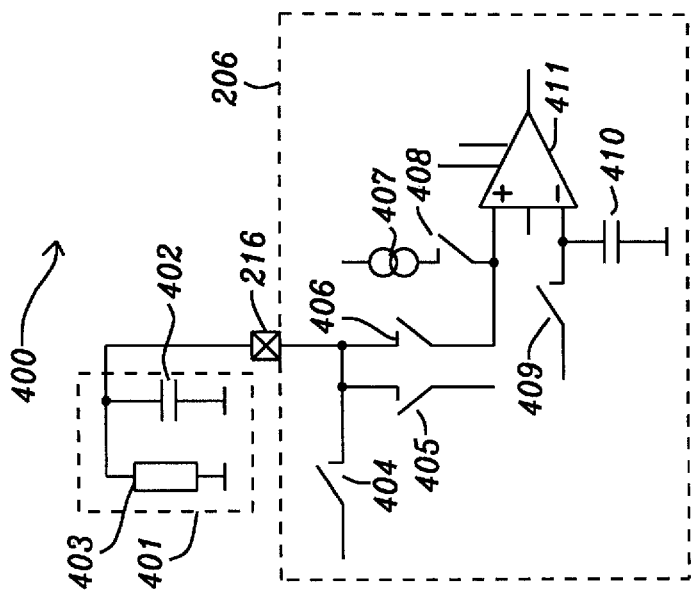

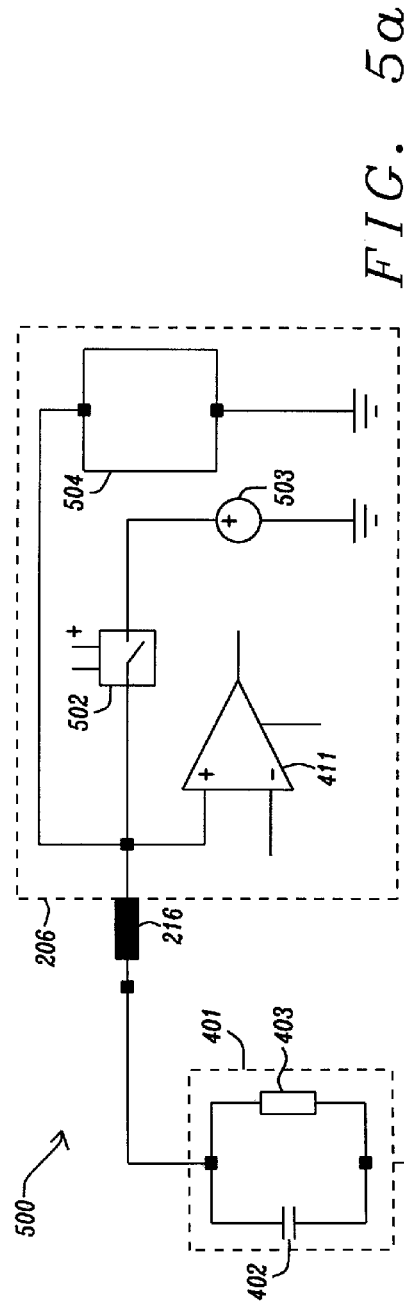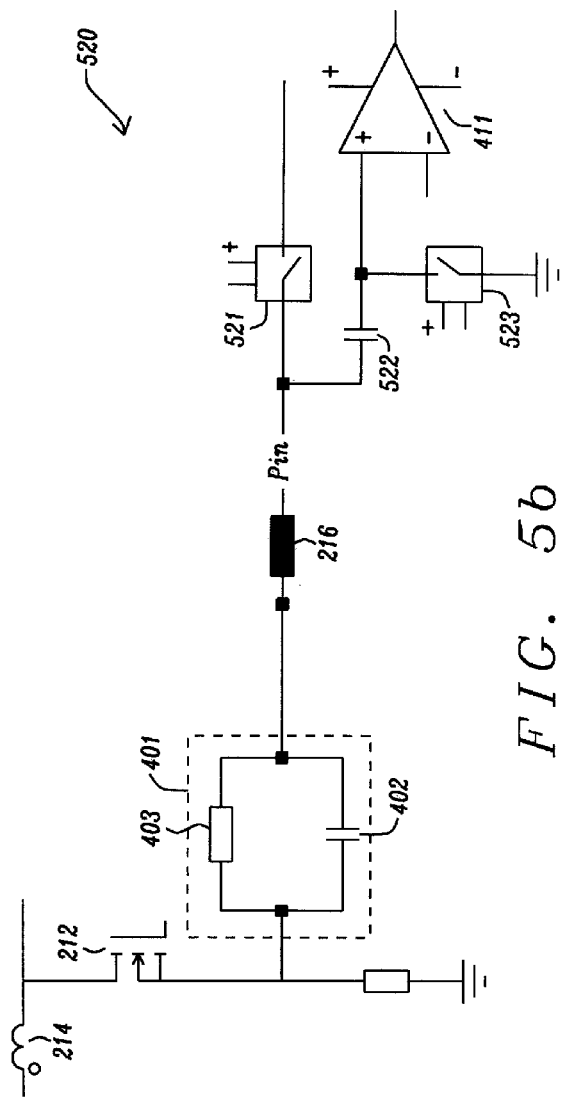

CIRCUIT AND METHOD FOR DETECTING THE DURATION OF THE INTERRUPTION OF A MAINS INPUT

This is a continuation application of U.S. Ser. No. 14/043, 965 filed on Oct. 2, 2013, herein incorporated by reference in its entirety, and which is assigned to a common assignee.

TECHNICAL FIELD

The present document relates to a power supply or driver circuit. In particular, the present document relates to a power supply or driver circuit for a light bulb assembly.

BACKGROUND

A power supply, e.g. a power supply for a light bulb assembly, should exhibit short start-up times, in order to allow for a quick start-up of the device coupled to the power supply, e.g. in order to allow for a quick start-up of the light bulb assembly. The power supply may be configured to convert electrical energy from a mains supply to electrical energy for a light source of a light bulb assembly at a pre-determined voltage level. Examples for light sources are light emitting diodes (LED) and/or organic LEDs (OLEDs), which are typically referred to as solid state lighting (SSL) devices. The power supply may also be referred to as a driver circuit.

Light bulb assemblies may be dimmable subject to control events received via the mains supply. Typically, phase-cut dimmers are used to cut a phase of the waveform of the current provided by the mains supply to the light bulb assembly. The phase-cut angle is typically indicative of the degree of dimming to be provided by the light bulb assembly. In the present document, a method for enabling dimming without the need of a phase-cut dimmer is described. This method makes use of brief interruptions of the mains supply which may be created by a brief off/on cycle using a mains power switch. Such a brief interruption of the mains supply may be interpreted by a controller comprised within the driver circuit of the light bulb assembly as an instruction to dim the light.

It is expected that the dimming of SSL based light bulb assemblies in response to events triggered by such off/on cycles of the mains power switch will become an important topic in the near future, as this technique allows the implementation of dimming without the need for a phase-cut dimmer. In order to enable a light bulb assembly to detect such off/on cycles, the controller of the driver circuit of the light bulb assembly may be provided with a counter for measuring the length of an OFF period, i.e. the period during which the mains supply is off. By doing this, the controller can distinguish between an off/on cycle (having a pre-determined maximum duration of the OFF period) for triggering the dimming of the light bulb assembly, and an intentional "turn-off" of the light bulb assembly (if the duration of the OFF period exceeds the pre-determined maximum duration).

If a timer or counter within the controller is used to measure the duration of an OFF period, the controller needs to maintain active operation even during time windows with no mains supply. As a consequence, relatively large storage capacitors may be required, in order to keep the controller running during the OFF period. However, the use of additional storage capacitors adds costs and space to the driver circuit. Furthermore, the use of additional and/or large storage capacitors may have a negative impact on the lifetime of the light bulb assembly, because such storage capacitors are typically Aluminum Electrolyte type capacitors which exhibit reduced lifetimes. In addition, the use of large storage capacitors (e.g. large supply voltage capacitors) may have a negative impact on the start-up time of the driver circuit and of the light bulb assembly.

The present document addresses the above mentioned technical problems and describes a driver circuit and/or power supply which enables the use of relatively small supply voltage capacitors (for short start-up times, reduced costs, reduced space and increased lifetime), while at the same time enabling the determination of the duration of an OFF period (for providing a light bulb assembly which is dimmable subject to off/on events of the mains supply).

SUMMARY

According to an aspect, a driver circuit or a power supply, e.g. for a light bulb assembly, is described. The driver circuit is configured to provide, at an output of the driver circuit, electrical energy at a drive voltage. The drive voltage may correspond to the on-voltage of a light source (e.g. an SSL based light source) of the light bulb assembly. The electrical energy at the drive voltage may be derived from electrical energy at an input voltage at an input of the driver circuit. The electrical energy at the input voltage may correspond to the electrical energy provided by a mains supply. In particular, the input voltage may correspond to a rectified mains voltage. Alternatively or in addition, the input voltage may correspond to a voltage provided by a transformer, e.g. for an halogen bulb. As such, the driver circuit (and the light bulb assembly) may be used for a replacement of halogen light bulbs.

The driver circuit may comprise a power converter configured to convert the electrical energy at the input voltage into the electrical energy at the drive voltage. By way of example, the power converter may comprise a switched-mode power converter, such as a boost converter, a buck converter, a buck-boost converter, a flyback converter and/or a SEPIC (Single-ended primary-inductor converter) converter. The power converter may comprise a power switch (e.g. a transistor such as a metal oxide semiconductor field effect transistor).

Furthermore, the driver circuit may comprise a controller (which is e.g. implemented as an integrated circuit). The controller may be configured to control the power converter (e.g. the power switch of the power converter) such that the power converter provides the electrical energy at the drive voltage. The controller is typically configured to stop operation subsequent to (and/or as a result of) an interruption of electrical energy provided at the input of the driver circuit (e.g. due to an interruption of the mains supply). Furthermore, the controller is typically configured to resume operation subsequent to (and/or as a result of) the provision of electrical energy at the input of the driver circuit (e.g. due to the provision of electrical energy by the mains supply).

The driver circuit may comprise a supply voltage capacitor which may be (directly) coupled to the controller and which may be configured to provide a supply voltage to the controller. The supply voltage capacitor may be charged using electrical energy provided at the input of the driver circuit (e.g. using the electrical energy provided by the mains supply). Subsequent to the interruption of the electrical energy provided at the input of the driver circuit, the supply voltage may drop. In particular, the interruption of the electrical energy may have the effect that the supply voltage capacitor is not recharged anymore. At the same time, the controller typically continues to draw a current from the supply voltage capacitor, thereby discharging the supply voltage capacitor. As a result, the supply voltage provided by the supply voltage capacitor drops. The controller is typically configured to stop operation, if the supply voltage is below a pre-determined supply voltage threshold. On the other hand, the controller is typically configured to resume operation, if the supply voltage is above the supply voltage threshold.

The driver circuit comprises a timing circuit which may be (directly) coupled to the controller. In particular, the timing circuit may couple a pin of the controller to ground (or to another pre-determined voltage level). The timing voltage at the timing circuit decays with a pre-determined time constant, if not maintained. By way of example, the timing circuit may comprise a capacitor. The capacitor may be arranged in parallel to a resistor. The timing voltage may correspond to the voltage drop across the capacitor and/or across the resistor. If the capacitor of the timing circuit is not recharged to maintain the timing voltage at a pre-determined level (e.g. at or above a first voltage level), the timing voltage may decay with the pre-determined time constant.

The controller may be configured to maintain the timing voltage at or above the first voltage level (also referred to as the on-voltage threshold), when the controller is in operation. In particular, the controller may be configured to couple the timing circuit to a voltage source to maintain the timing voltage at or above the first voltage level. This may be achieved by one or more power switches comprised within the controller, which are configured to recharge the capacitor of the timing circuit using the electric energy provided at the input of the driver circuit. Furthermore, the controller may be configured to interrupt the maintenance of the timing voltage, when the controller has stopped operation. In particular, the controller may be configured to stop the recharging of the capacitor, once the controller has stopped operation.

Furthermore, the controller may be configured to determine an indication of a residual level of the timing voltage when the controller resumes operation. In particular, upon resumption of operation, the controller may be configured to first determine the indication of the residual level of the timing voltage and to then bring back the timing voltage up to the first voltage level (e.g. by recharging the capacitor of the timing circuit). The indication of the residual level of the timing voltage may e.g. comprise (or correspond to) an indication on whether the residual level of the timing voltage is greater than or smaller than a pre-determined second voltage level (referred to herein as the low-voltage threshold).

In addition, the controller may be configured to determine an indication of the duration of an interruption of electrical energy provided at the input of the driver circuit. The indication of the duration may be determined based on the indication of the residual level of the timing voltage. The indication of the duration may comprise (or may correspond) to an indication on whether the duration is greater than or smaller than a pre-determined duration threshold (corresponding e.g. to a pre-determined number of cycles of the mains voltage). The controller may further take into account the first voltage level and the pre-determined time constant for determining the indication of the duration of the interruption of electrical energy provided at the input of the driver circuit.

The controller may be configured to couple the timing circuit with a comparator (comprising e.g. an operational amplifier). The comparator may be implemented within the controller. The comparator may be configured to compare the timing voltage with a reference voltage (also referred to as the second voltage level or as the low voltage threshold). The reference voltage may depend on the pre-determined time constant of the timing circuit. Furthermore, the reference voltage may depend on the first voltage level. In addition, the reference voltage may depend on the pre-determined duration threshold. In particular, the reference voltage may be selected such that a residual value of the timing voltage which lies above the reference voltage indicates a duration of the interruption which is below the pre-determined duration threshold and such that a residual value of the timing voltage which lies below the reference voltage indicates a duration of the interruption which is above the pre-determined duration threshold. The comparator may be configured to indicate whether the timing voltage is greater or smaller than the reference voltage, thereby providing an indication of the residual level of the timing voltage. As such, the comparator may be configured to indicate whether the duration of the interruption is greater than or smaller than the pre-determined duration threshold.

By using a timing circuit which is separate from the controller, it may be achieved to determine (an indication of) the duration of the interruption of electrical energy provided at the input of the driver circuit (e.g. the interruption of the mains supply), without the need of increasing the capacitance of the supply voltage capacitor, i.e. without the need of increasing the start-up time of the driver circuit.

As indicated above, the power converter may comprise a power switch. The power switch may be arranged in series with a shunt resistor (wherein the shunt resistor may link the source of the power switch directly to ground). The shunt resistor may be arranged such that a voltage drop at the shunt resistor is indicative of a current through the power switch. The timing circuit may couple the controller to the shunt resistor (via a pin of the controller). As such, the pin of the controller may be used for measuring the current through the power switch (during normal operation of the controller) and for measuring the residual value of the timing voltage (subsequent to an interruption of operation of the controller). As such, no additional pin is needed at the controller to perform the measurement of the residual value of the timing voltage.

The controller may be configured to couple the timing circuit with the comparator via a compensation capacitor. The compensation capacitor may be configured to compensate the timing voltage such that the voltage at the comparator corresponds to the voltage drop at the shunt resistor. The driver circuit may further comprise an auto zeroing switch configured to couple the compensation capacitor to a pre-determined potential, when charging the compensation capacitor. The auto zeroing switch may ensure that the voltage drop across the compensation capacitor corresponds to the inverse of the timing voltage. By doing this, it can be ensured that the voltage at the input of the comparator corresponds to the voltage drop at the shunt resistor, thereby allowing the comparator to measure the current through the power switch during normal operation of the controller.

The driver circuit may be configured to provide the electrical energy at the drive voltage to a solid state lighting light source (e.g. to a plurality of LEDs or OLEDs). The controller may be configured to operate the power converter according to a plurality of different operation states corresponding to a plurality of different illumination states of the light source. Examples for illumination states are e.g. an "off" state with no illumination, an "on" state with a maximum illumination level, a "dim up" state with a smoothly increasing illumination level and a "dim down" state with a smoothly decreasing illumination level.

In particular, the controller may be configured to operate the driver circuit according to a current operation state and to detect one of a plurality of pre-determined events based on the input voltage. The plurality of pre-determined events may comprise an "off" event, an "off/on" event and an "on" event. Detecting the "off" event may comprise detecting that the input voltage lies below a pre-determined first input voltage threshold for more than the pre-determined duration threshold. Detecting the "off/on" event may comprise detecting that the input voltage lies below the pre-determined first input voltage threshold for less than the pre-determined duration threshold. Detecting the "on" event may comprise detecting that the input voltage lies above a pre-determined second input voltage threshold. The first input voltage threshold may be lower than the second input voltage threshold.

The controller may be configured to determine a target operation state in accordance to a pre-determined state machine, based on the current operation state and based on the detected one of the plurality of pre-determined events. The pre-determined state machine may define transitions between different operation states subject to detected events. Subsequent to determining the target operation state, the controller may be configured to operate the driver circuit in accordance to the target operation state (e.g. for dimming the light source).

The driver circuit may further comprise an output capacitor at the output of the driver circuit. The output capacitor may be configured to store an electrical charge to be provided to a load (e.g. the light source) of the driver circuit. The output capacitor may be arranged in parallel to the load. The driver circuit may be configured to transfer electrical energy from an inductor of the power converter to the output capacitor during an off-state of the power switch. The electrical charge of the output capacitor may be used to provide electrical energy to the load (e.g. during an interruption of the input voltage).

According to a further aspect, a light bulb assembly is described. The light bulb assembly may comprise an electrical connection module configured to electrically connect to a mains power supply, thereby providing electrical energy at the input voltage. Furthermore, the light bulb assembly may comprise a driver circuit as described in the present document. The driver circuit may be configured to provide electrical energy at the drive voltage derived from the electrical energy at the input voltage. Furthermore, the light bulb assembly comprises a light source (e.g. a series of LEDs or OLEDs) configured to provide light using the electrical energy at the drive voltage.

According to another aspect, a method for operating a controller and/or a driver circuit as outlined in the present document is described. The method may comprise steps which correspond to the features of the controller and/or driver circuit described in the present document. In particular, a method for determining an indication of the duration of an interruption of electrical energy provided to a driver circuit is described. The method may comprise controlling a power converter to convert electrical energy at an input voltage into electrical energy at a drive voltage using a controller. Furthermore, the method may comprise maintaining a timing voltage at a timing circuit above a first voltage level, when controlling the power converter. The timing circuit is separate from the controller and the timing voltage at the timing circuit decays with a pre-determined time constant if not maintained. The method may comprise stopping controlling the power converter and stopping maintaining the timing voltage, subsequent to an interruption of electrical energy provided to the driver circuit. In addition, the method may comprise resuming controlling the power converter, subsequent to the provision of electrical energy to the driver circuit. An indication of a residual level of the timing voltage may be determined when resuming controlling the power converter. The indication of the duration of the interruption of electrical energy provided to the driver circuit may be determined based on the first voltage level, based on the pre-determined time constant and/or based on the indication of the residual level of the timing voltage.

According to a further aspect, a software program is described. The software program may be adapted for execution on a processor and for performing the method steps outlined in the present document when carried out on the processor.

According to another aspect, a storage medium is described. The storage medium may comprise a software program adapted for execution on a processor and for performing the method steps outlined in the present document when carried out on the processor.

According to a further aspect, a computer program product is described. The computer program may comprise executable instructions for performing the method steps outlined in the present document when executed on a computer.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

BRIEF DESCRIPTION OF THE DRAWINGS

The invention is explained below in an exemplary manner with reference to the accompanying drawings.

FIG. 4a shows a block diagram of an example circuit arrangement configured to measure the duration of an OFF period of the mains supply.

FIG. 4b shows the voltages at the timing circuit as a function of time.

FIGS. 5a and 5b show circuit diagrams of example circuit arrangements configured to measure the duration of an OFF period of the mains supply.

DESCRIPTION

In the present document, a light bulb "assembly" includes all of the components required to replace a traditional incandescent filament-based light bulb, notably light bulbs for connection to the standard electricity supply. In British English (and in the present document), this electricity supply is referred to as "mains" electricity, whilst in US English, this supply is typically referred to as power line. Other terms include AC power, line power, domestic power and grid power. It is to be understood that these terms are readily interchangeable, and carry the same meaning.

Typically, in Europe electricity is supplied at 230-240 VAC, at 50 Hz (mains frequency) and in North America at 110-120 VAC at 60 Hz (mains frequency). The principles set out in the present document apply to any suitable electricity supply, including the mains/power line mentioned, and a DC power supply, and a rectified AC power supply.

Figure 1:
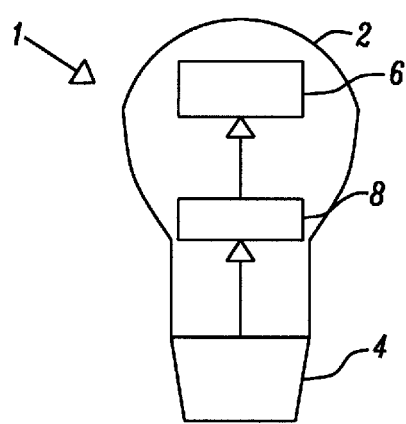
FIG. 1 illustrates a block diagram of an example light bulb assembly.

FIG. 1 is a schematic view of a light bulb assembly. The assembly 1 comprises a bulb housing 2 and an electrical connection module 4. The electrical connection module 4 can be of a screw type or of a bayonet type, or of any other suitable connection to a light bulb socket. Typical examples for an electrical connection module 4 are the E11, E14 and E27 screw types of Europe and the E12, E17 and E26 screw types of North America. Furthermore, a light source 6 (also referred to as an illuminant) is provided within the housing 2. Examples for such light sources 6 are a CFL tube or a solid state light source 6, such as a light emitting diode (LED) or an organic light emitting diode (OLED) (the latter technology is referred to as solid state lighting, SSL). The light source 6 may be provided by a single light emitting diode, or by a plurality of LEDs.

Driver circuit 8 is located within the bulb housing 2, and serves to convert supply electricity received through the electrical connection module 4 into a controlled drive current for the light source 6. In the case of a solid state light source 6, the driver circuit 8 is configured to provide a controlled direct drive current to the light source 6.

The housing 2 provides a suitably robust enclosure for the light source and drive components, and includes optical elements that may be required for providing the desired output light from the assembly. The housing 2 may also provide a heat-sink capability, since management of the temperature of the light source may be important in maximising light output and light source life. Accordingly, the housing is typically designed to enable heat generated by the light source to be conducted away from the light source, and out of the assembly as a whole.

The driver circuit 8 of a light bulb assembly 1 should be configured to provide a drive current to the light source 6 almost instantaneously, subsequent to turning on of the mains supply (e.g. subsequent to a user switching on the light). Consequently, the driver circuit 8 should exhibit a low start-up time. On the other hand, the driver circuit 8 should be configured to measure the duration of short interruptions of the mains supply which may be used to control the behaviour of the light bulb assembly 1. By way of example, intentional interruptions of the mains supply may enable a user to control the dimming of the light bulb assembly 1 using an on/off light switch. The driver circuit 8 should be configured to determine the duration of such interruptions without impacting the start-up time of the driver circuit 8.

In the following, an example driver circuit 8 for a light bulb assembly 1 is described in more detail. In particular, a driver circuit 8 is described which may be used to control the dimming level of the light source 6 of the light bulb assembly 1, subject to intentional interruptions of the mains supply.

Figure 2:
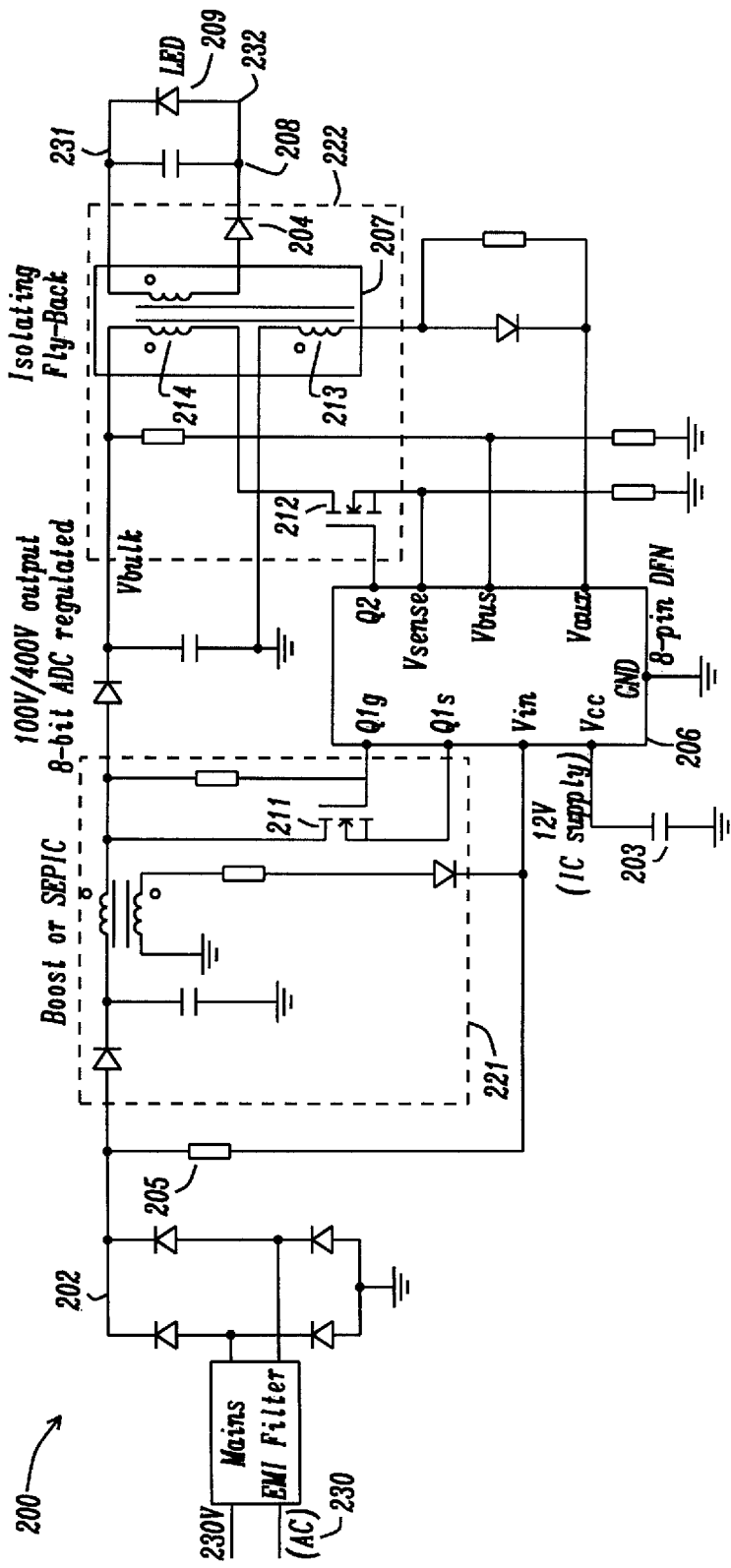
FIG. 2 shows a circuit diagram of an example driver circuit.

FIG. 2 illustrates a circuit diagram of an example driver circuit 200, 8 of a light bulb assembly 1. The driver circuit 200 comprises an electromagnetic interference (EMI) filter unit 201 and a rectifier 202, in order to generate a rectified voltage from the main supply 230. It should be noted that the voltage 230 may be referred to in general terms as an input voltage 230. The input voltage 230 may correspond to the voltage provided by a transformer (e.g. 12V or 24V), e.g. for an halogen light bulb. The transformer may e.g. comprise a 50 Hz transformer and/or an electronic transformer. Furthermore, the driver circuit 200 comprises a controller 206 which is configured to control one or more power switches 211, 212 of one or more switched-mode power converters 221, 222. The current through a power switch 212 may be sensed at a pin 216 of the controller 206 using a shunt resistor 215. As such, the shunt resistor 215 may be viewed as current sensing means for sensing the current through the power switch 212. The controller 206 may use the sensed current through the power switch 212 for controlling the switching time instant of the power switch 212.

The controller 206 may be started using the start-up resistor 205. The start-up resistor 205 may be coupled via an internal connection within the controller 206 to the supply voltage capacitor 203 of the controller 206, thereby enabling the charging of the supply voltage capacitor 203. Once the supply voltage capacitor 203 has reached a sufficient charging level, the controller 206 can start operation. The charge of the supply voltage capacitor 203 may be used to maintain the supply voltage for the controller 206 at a pre-determined level, and to bridge brief interruptions of the mains supply. The duration of the interruptions which may be bridged depend on the capacitance of the supply voltage capacitor 203. If the charge of the supply voltage capacitor 203 drops below a pre-determined level, i.e. if the voltage drop at the supply voltage capacitor 203 drops below a pre-determined voltage level (e.g. due to an interruption of the mains supply), the controller 203 stops operation.

In the illustrated example, the driver circuit 200 comprises a two-stage power converter 221, 222 with the first stage 221 being a Boost converter and the second stage 222 being a flyback converter. The flyback converter comprises a transformer 207 having a primary winding 214, a secondary winding and an additional auxiliary winding 213. The auxiliary winding 213 may be used to provide information to the controller 206 regarding the output voltage 231 (also referred to as the drive voltage) of the driver circuit 200. Furthermore, the driver circuit 200 comprises an output capacitor (or storage capacitor) 208 which stores electrical energy to be provided to the light source 6, 209. The driver circuit 200 is configured to provide the light source 209 with the drive voltage 231 (which corresponds e.g. to the on-voltage of an LED device) and with a drive current 232 (which may be controlled in order to control the illumination level of the light source 209).

The driver circuit 200 (and in particular the controller 206) may be configured to detect one or more events encoded within the mains voltage 230. By way of example, the mains voltage 230 may be submitted to a mains switch (e.g. an on/off switch) configured to provide and to interrupt the mains voltage 230. A brief intentional interruption of the mains voltage 230 (e.g. having a duration which exceeds a minimum number of cycles of the mains supply 230 and which is smaller than a maximum number of cycles of the mains supply 230) may be interpreted by the controller 206 as a so called "Off/On event". Furthermore, the controller may be configured to detect an "On event", subject to the mains switch being turned on, thereby providing the mains voltage 230. In addition, the controller may be configured to detect an "Off event", subject to an interruption of the mains voltage having a duration which exceeds the above mentioned maximum number of cycles of the mains supply 230.

The controller 206 may comprise a state machine (e.g. encoded as software, firmware or hardware). The state machine may define a plurality of illumination states of the light source 209, as well as events which trigger transitions between the illumination states. By way of example, the plurality of illumination states may comprise a "Hold" illumination state at a fixed illumination level, a "Max" illumination state at a maximum illumination level, an "Off" illumination state at zero illumination level, a "dim up" illumination state (where the illumination level is smoothly increased) and/or a "dim down" illumination state (where the illumination level is smoothly decreased).

The controller 206 may be configured to determine a target illumination state of the light source 209 starting from a current illumination state, in accordance to the pre-determined state machine. In particular, the controller 206 may be configured to define and adjust settings of the driver circuit 200 (e.g. the duty cycle of a power switch 211, 212), which control the respective behavior of the light source 209 for the corresponding illumination states. The settings of the driver circuit 200 (e.g. the length of the duty cycle of a power switch 211, 212) may be stored in a memory of the controller 206.

Figure 3:
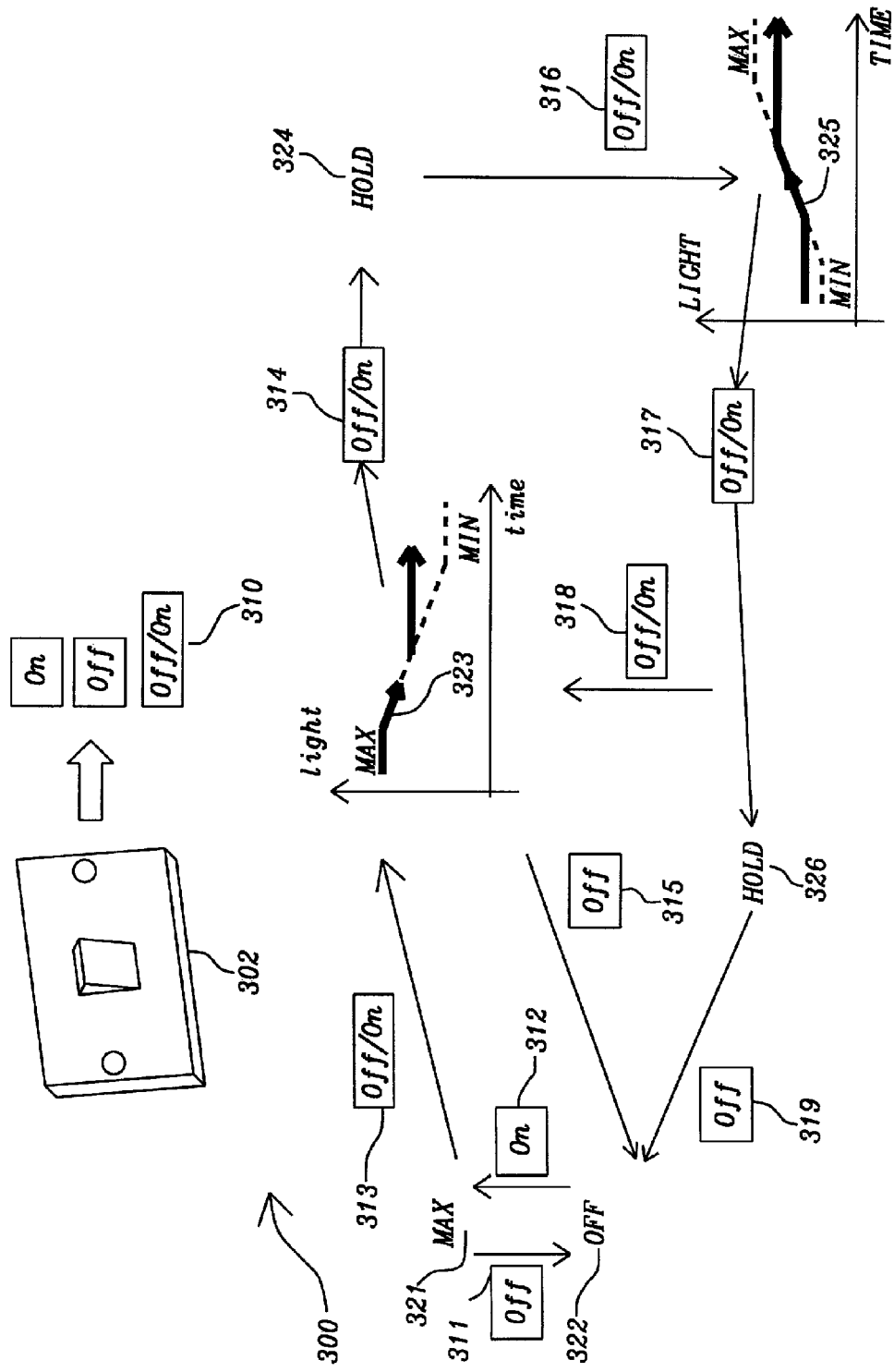
FIG. 3 illustrates an example method for enabling dimming of a light bulb assembly using a mains switch.

FIG. 3 illustrates a method 300 which makes use of a mains switch 302 as signaling means, in order to encode a plurality of events 310. The example events of FIG. 3 are an "ON" event, corresponding to a switch 302 which is kept on for a minimum pre-determined time interval; an "OFF event, corresponding to a switch 302 which is kept off for a minimum pre-determined time interval; and an "OFF/ON" event, corresponding to an event where the switch 302 is briefly switched from ON to OFF and then back to ON within a predetermined time interval. These three events in combination with various illumination states can be used to provide a dimming function (even when no phase-cut dimmer is available at the mains supply).

It can be seen from FIG. 3, how the ON event 312 can be used to change the driver circuit 200 from the state "OFF", i.e. no intensity, (reference numeral 322) to the state "MAX", i.e. maximum intensity, (reference numeral 321), and how the OFF event 311 can be used to perform the inverse change of states. When in the "MAX" state 321, the OFF/ON event 313 can be used to put the driver circuit 200 into a dim down state 323. The dim down state 323 triggers a smooth decrease in intensity down towards a minimum intensity (e.g. 20% intensity). Using another OFF/ON event 314, the dim down state 323 may be stopped, thereby putting the driver circuit 200 into a hold state 324 at the current intensity. When detecting another OFF/ON event 316, the driver circuit 200 is put into a dim up state 325, thereby smoothly increasing the intensity up to the maximum intensity. Another OFF/ON event 317 may again put the driver circuit 200 into a hold state 326 (which differs from the hold state 324 in that a subsequent OFF/ON event 318 will retrigger the dim down state 323, instead of the dim up state 325). Whenever detecting an OFF event 315, 319, the driver circuit 200 is put into the OFF state 322. In the example method 300 (and the corresponding example state machine of the controller 206), this OFF state 322 can only be left, when detecting an ON event 312.

In order to provide light bulb assemblies 1 which may be dimmed using the control method 300 illustrated in FIG. 3, the driver circuit 200 should be configured to determine the duration of interruptions of the mains supply 230 (which are used to signal an "Off/on" event). This could be achieved by using a counter within the controller 206. This, however, requires the controller 206 to maintain operation without receiving energy from the mains supply. The operation of the controller 206 may be maintained using a supply voltage capacitor 203 having an increased capacity, thereby extending the duration during which the supply voltage capacitor 203 can supply power to the controller 206. Typically, the controller 206 draws a current in the range of 50 μA. Consequently, a relatively large supply voltage capacitor 203 is required if an interruption of about 1 or 2 seconds duration is to be bridged and the duration of the interruption is to be determined. However, a large supply voltage capacitor 203 leads to increased start-up times which is in contradiction with the design requirement of providing a light bulb assembly 1 which emits light almost instantaneously, in response to turning on of the mains switch 302.

In the present document it is proposed to use a dedicated circuit arrangement for measuring the duration of an interruption of the mains supply (referred to as an "OFF" period), wherein the dedicated circuit arrangement is separate from the controller 206. The dedicated circuit arrangement may be configured to provide an indication of the duration of an interruption of the mains supply, even if the controller 206 has stopped operation due to the interruption of the mains supply. The circuit arrangement may be referred to as a timing circuit exhibiting a time constant. By way of example, the timing circuit may comprise an RC circuit exhibiting the time constant given by $\tau=RC$, wherein R is the resistance of a resistor and wherein C is the capacitance of a capacitor of the RC circuit.

FIG. 4a shows a circuit arrangement 400 comprising an example timing circuit 401. The timing circuit 401 comprises an RC circuit with a capacitor 402 arranged in parallel with a resistor 403. The timing circuit 401 may be coupled to the controller 206 via a pin 216. The controller 206 and the timing circuit 401 may be part of the driver circuit 200 of a light bulb assembly 1. During normal operation of the controller 206 (i.e. during "ON" periods of the mains supply, when the mains switch 302 is switched on), the controller 206 may be configured to maintain the voltage 422 at the timing circuit 401 at a pre-determined level. This may be achieved e.g. using switches 404 and 405 of the controller 206. On the other hand, when the controller 206 stops operation (e.g. subject to an "OFF" period of the mains supply, triggered by the mains switch 302 being switched off), the timing circuit 401 may not be recharged anymore. As a result, the voltage 422 at the timing circuit 401 may decrease in accordance to the time constant τ of the timing circuit 401. This is illustrated in FIG. 4b where the voltage 422 at the timing circuit 401 is shown as a function of time 421. It can be seen that during operation of the controller 206, the voltage 422 at the timing circuit 401 is maintained at or above a pre-determined on-voltage threshold 423. When the controller 206 stops operation, the voltage 422 at the timing circuit 401 drops in accordance to the time constant τ. As soon as the controller 206 resumes operation (e.g. at time instant 426), the voltage 422 at the timing circuit 401 is brought back up to or above the on-voltage threshold 423. On the other hand, if the controller 206 does not resume operation for a certain time period, the voltage 422 at the timing circuit 401 drops below a pre-determined off-voltage threshold 424 (e.g. at time instant 427).

The controller 206 may be configured to measure the voltage 422 at the timing circuit 401 when resuming operation (e.g. at time instant 426) prior to bringing back up the voltage 422 at the timing circuit 401 (e.g. prior to recharging the capacitor 402 of the timing circuit 401). The voltage 422 at the timing circuit 401 may be referred to as the timing voltage 422. The timing voltage 422 may be measured prior to recharging of the timing circuit 401 using the switches 404, 405. The controller 206 may be configured to couple the timing circuit 401 via the pin 216 to a comparator 411 (e.g. using an internal switch 406). The comparator 411 may be configured to compare the timing voltage 422 at time instant 426 with a reference voltage (wherein the reference voltage may be provided by the capacitor 410 which is charged via the switch 409). The reference voltage may e.g. correspond to the off-voltage threshold 424.

As such, the comparator 411 may be configured to determine whether the timing voltage 422 at the time instant 426 is greater or smaller than the off-voltage threshold 424. In view of the pre-determined time constant τ of the timing circuit 401 (which defines the speed of decay of the timing voltage 422), the off-voltage threshold 424 is directly related to the duration 425 of an OFF period. By way of example, the time constant τ may define the duration for the timing voltage 422 to drop from a value $V_O$ to a value $\underline{v}_o$, wherein e is Euler's number. Consequently, the duration of an OFF period can be determined knowing the initial value of the timing voltage 422, knowing the time constant τ and knowing the value of the timing voltage 422 at the time instant 426 when the controller 206 resumes operation. In particular, it may be determined whether the duration of the OFF period is above or below a pre-determined duration threshold (which corresponds e.g. to a pre-determined number of cycles of the mains supply) by determining whether the timing voltage 422 at the time instant 426 is above or below the pre-determined off-voltage threshold 424.

The on-voltage threshold 423 and the off-voltage threshold 424 (as well as the time constant τ) may be selected based on the above mentioned maximum number of cycles of the mains supply 230, which correspond to the maximum duration of an OFF period, which is interpreted by the controller 206 to be an "Off/On" event. The comparator 411 is configured to determine whether the timing voltage 422 at the end 426 of an OFF period is below or above the off-voltage threshold 424. If the timing voltage 422 is above the off-voltage threshold 424, the controller 206 may detect an "Off/On" event. On the other hand, if the timing voltage 422 is below the off-voltage 424, the controller 206 may detect an "Off" event.

The circuit arrangement 400 may make use of a biasing circuit 407, 408 in order to adjust the measured timing voltage 422 to different levels.

Hence, an external analog R/C timing element 401 may be used together with an intelligent charge/detect circuit 411 in order to measure the duration of a mains switch off/on window and in order to generate trigger events for various dimming actions.

For the switch dim function the latest dimming information has stored over a time of about 2 seconds including a function of time out. An external RC combination can be used for this function. By way of example, as shown in FIG. 5a, the circuit arrangement 500 may comprise a data storage 504 (which may e.g. comprise a Random Access Memory). The data storage 504 may be implemented within the controller 206. The data storage 504 may be configured to store a current state of the light bulb assembly 1 (e.g. a current illumination level of the light source 209). The timing circuit 401 may be configured to supply energy to the data storage 504 for a pre-determined amount of time (e.g. for an amount of time which corresponds to the pre-determined duration threshold used to detect an OFF/ON event). As such, the data storage 504 may be configured to store the current state of the light source 209 for a duration which is sufficiently long to bridge an interruption of the mains supply having a duration which corresponds to the duration of an OFF/ON event. By doing this, the state machine of the controller 206 may determine the target state of the light source 209 based on the current state of the light source 209 stored in the data storage 504.

On the other hand, if the duration of the interruption exceeds the pre-determined amount of time (e.g. the pre-determined duration threshold), the voltage at the data storage 504 drops below a pre-determined threshold (e.g. below the low voltage threshold 424) such that the data storage 504 may be reset. The light bulb assembly 1 may then start operation from a default starting state (e.g. the MAX illumination state).

FIG. 5a shows a further circuit arrangement 500 comprising a controller 206 and a timing circuit 401. The timing circuit 401 is coupled on a first side of the timing circuit 401 to ground and on another side of the timing circuit to a pin 216 of the controller 206. The timing voltage 422 corresponds to the voltage drop across the timing circuit 401 between the pin 216 of the controller 206 and ground. During normal operation, the capacitor 402 of the timing circuit 401 may be charged to an initial voltage $V_O$ using the voltage source 403 and the switch 502. The initial voltage $V_O$ is typically at or above the on-voltage threshold 424. If the power fails (e.g. when the controller 206 stops operation or when an interruption of the mains supply is detected), the capacitor 402 will not be re-charged anymore and the capacitor 402 is discharged via the resistor 403, wherein the timing voltage 422 is reduced in accordance to the time constant given by τ=RC. The voltage will be high enough, that the data will be stored.

As outlined above, the data storage 504 may be configured to store the current illumination state of the light source 209 (e.g. the current dim level). The data storage 504 (e.g. a RAM) may require a pre-determined minimum voltage level for operation. The voltage for the data storage 504 may be provided by the timing circuit 401. If the voltage level drops below the pre-determined minimum voltage level (which may correspond to or which may be below the low voltage threshold 424), the information stored within the data storage 504 may be lost.

When the supply voltage is turned on again, the remaining timing voltage 422 (also referred to as the residual value of the timing voltage 422) at the timing circuit 401 provides an indication of the duration of the interruption of the mains supply. The comparator 411 may be configured to determine the remaining timing voltage 422. In particular, the comparator 411 may be configured to determine whether the remaining timing voltage 422 is greater or smaller than a pre-determined reference voltage (e.g. the off-voltage threshold 424).

It should be noted that the ground node of the timing circuit 401 may also be e.g. a shunt of an external switch 212. This is illustrated in the circuit arrangement 520 of FIG. 5b which shows the timing circuit 401 in conjunction with the external switch 212 of a switched-mode power converter 222 (see e.g. FIG. 2). The timing circuit 401 is arranged between the source of the external switch 212 and the pin 216 of the controller 206. Furthermore, the timing circuit 401 may be coupled to ground via the shunt resistor 215, wherein the shunt resistor 215 is indicative of the current through the external switch 212. By doing this, the pin 216 of the controller 206 can be used for sensing the current through the external switch 212 (during normal operation of the controller 206) and for sensing the timing voltage 422 (subsequent to an interruption of the operation of the controller 206).

During normal operation, the external switch 212 alternates between on-state and off-state. When the external switch 212 is in off-state (and no current is flowing through the switch 212), the switch 521 may be closed, thereby providing a pre-determined voltage level (e.g. 5V) at the pin 216. As a consequence, the capacitor 402 of the timing circuit 401 is re-charged such that the timing voltage 422 corresponds to the pre-determined voltage level. At the same time, the autozeroing switch 523 may be closed, thereby (re-)charging the compensation capacitor 522 to bring the compensation capacitor 522 to the pre-determined voltage level. When the external switch 212 is put into on-state, the autozeroing switch 523 is open, and the voltage drop at the shunt resistor 215 may be provided to the comparator 411 via the capacitor 402 of the timing circuit 401 (referred to as the timing capacitor) and via the compensation capacitor 522. The timing voltage 422 at the timing capacitor 402 is compensated by the inverse voltage at the compensation capacitor 522. As such, the comparator 411 may be used to supervise the current through the external switch 212 during normal operation of the controller 206. In particular, during normal operation of the controller 206, the comparator 411 may determine whether the current through the external switch 212 reaches or exceeds a pre-determined current peak.

On the other hand, the comparator 411 may be used to determine the level of the timing voltage 422, upon resumption of operation of the controller 206. In this context, the reference voltage at the comparator 411 may be modified. In particular, a different reference voltage may be used for measuring the current peak (during normal operation) and for measuring the residual level of the timing voltage 422. Alternatively or in addition, the timing voltage 422 may be biased (using e.g. the biasing circuit 407, 408 illustrated in FIG. 4), such that the same reference voltage may be used for measuring the current peak and for measuring the residual level of the timing voltage 422.

It should be noted that the autozeroing switch 523 does not necessarily have to be coupled to ground. The autozeroing switch 523 may also be coupled to a different potential if the reference voltage of the comparator 411 is selected accordingly. As such, the autozeroing switch 523 may be coupled to any other potential than ground. The main function of the autozeroing switch 523 (and the compensation capacitor 522) is to ensure that the voltage of the capacitor 402 of the timing circuit 401 is compensated, thereby providing an indication of the voltage drop at the shunt resistor 215 at the comparator 411.

Figure 6:
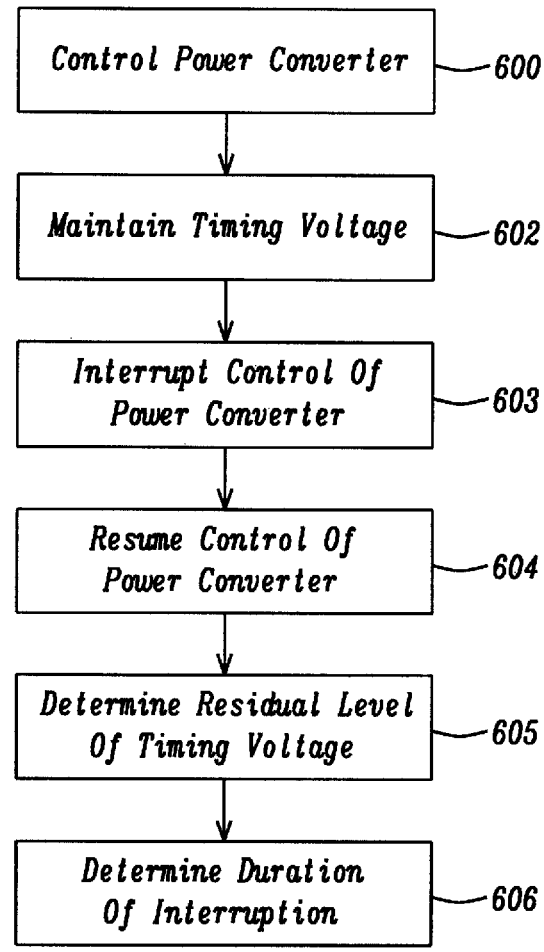
FIG. 6 illustrates a flow chart of an example method for providing an indication of the duration of an OFF period of the mains supply.

FIG. 6 illustrates a flow chart of an example method 600 for determining an indication of the duration of an interruption of electrical energy provided to a driver circuit 200 (e.g. an interruption of the mains supply). The method 600 comprises the step of controlling 601 a power converter 221, 222 such that the power converter converts electrical energy at an input voltage 230 into electrical energy at a drive voltage 231. The controlling step 601 may be performed using the controller 206 described in the present document. Furthermore, the method may comprise the step of maintaining 602 a timing voltage 422 at a timing circuit 401 above a first voltage level 423, when controlling the power converter 221, 222. As outlined in the present document, the timing circuit 401 is separate from the controller 206. Furthermore, the timing voltage 422 at the timing circuit 401 typically decays with a pre-determined time constant if not maintained at or above the first voltage level 423 by the controller 206.

The method may further comprise the step of stopping or interrupting 603 controlling 601 of the power converter 221, 222 (e.g. due to an interruption of the controller 206). As a result of the interrupted controller 206, maintenance 602 of the timing voltage 422 may be stopped. The interruption of the controller 206 and the resulting interruption of the maintenance of the timing voltage 422 typically occurs subsequent to (and as a result of) an interruption of electrical energy provided to the driver circuit 200. The method 600 may proceed in resuming 604 controlling the power converter 221, 222. The controller 206 may resume operation subsequent to (and as a result of) the provision of electrical energy to the driver circuit 200. The provision of electrical energy to the driver circuit 200 may be due to an interruption of the mains supply (e.g. caused by the switching off of a mains switch). The method may comprise the step of determining 605 an indication of a residual level of the timing voltage 422 when resuming 604 the control of the power converter 221, 222. The indication of the duration of the interruption of electrical energy provided to the driver circuit 200 may be determined 606, e.g. based on the first voltage level 423, e.g. based on the pre-determined time constant and e.g. based on the indication of the residual level of the timing voltage 422. The indication of the residual level of the timing voltage 422 may e.g. be an indication whether the residual level of the timing voltage 422 is above or below a pre-determined off-voltage threshold 424.

In the present document, a driver circuit comprising a timing circuit and a corresponding method have been described. The driver circuit is configured to determine the duration of an interruption of the mains supply without the need for a stable supply voltage. The timing circuit is independent of the rest of the driver circuit. In particular, the timing circuit is independent of the supply voltage provided by a supply voltage capacitor of the driver circuit. As a result, the driver circuit may use relatively small supply voltage capacitors, thereby enabling a short start-up time of the driver circuit. At the same time, the driver circuit is enabled to measure the duration of an interruption of the mains supply, thereby enabling the driver circuit for mains power switch controlled dimming applications.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A light bulb assembly comprising:
   an electrical connection module configured to electrically connect to a mains power supply, thereby providing electrical energy at an input voltage;
   a driver circuit configured to provide electrical energy at a drive voltage from the electrical energy at the input voltage, said driver circuit comprising:
      a power converter configured to convert the electrical energy at the input voltage into electrical energy at the drive voltage;
      a controller configured to control the power converter such that the power converter provides the electrical energy at the drive voltage, wherein the controller is configured to stop operation subsequent to an interruption of electrical energy provided at the input of the driver circuit, and resume operation subsequent to the provision of electrical energy at the input of the driver circuit; and
      a timing circuit coupled to the controller, wherein a timing voltage at the timing circuit decays with a pre-determined time constant if not maintained, and wherein the controller is configured to maintain the timing voltage at or above a first voltage level when the controller is in operation, determine an indication of a residual level of the timing voltage when the controller resumes operation after an interruption of electrical energy provided at the input of the driver circuit, and determine an indication of the duration of the interruption of electrical energy provided at the input of the driver circuit based on the first voltage level, the pre-determined time constant, and an indication of the residual level of the timing voltage; and
   a light source configured to provide light using the electrical energy at the drive voltage.

2. The light bulb assembly of claim 1, wherein the timing circuit comprises a capacitor arranged in parallel to a resistor.

3. The light bulb assembly of claim 1 wherein the timing circuit couples a pin of the controller to ground.

4. The light bulb assembly of claim 1 wherein the power converter comprises a power switch, the controller is configured to control the power switch such that the power converter provides the electrical energy at the drive voltage, the driver circuit comprises a shunt resistor arranged in series with the power switch, such that a voltage drop at the shunt resistor is indicative of a current through the power switch, and the timing circuit couples the controller to the shunt resistor.

5. The light bulb assembly of claim 4, wherein the controller is configured to couple the timing circuit with a comparator via a compensation capacitor and the compensation capacitor is configured to compensate the timing voltage such that the voltage at the comparator corresponds to the voltage drop at the shunt resistor.

6. The light bulb assembly of claim 5, wherein the driver circuit comprises an autozeoring switch configured to couple the compensation capacitor to a pre-determined potential when charging the compensation capacitor, the compensation capacitor is configured to compensate the timing voltage such that the voltage at the comparator corresponds to the voltage drop at the shunt resistor, and the driver circuit comprises an auto zeroing switch configured to couple the compensation capacitor to a pre-determined potential when charging the compensation capacitor.

7. The light bulb assembly of claim 1 wherein the controller is configured to couple the timing circuit to a voltage source thereby maintaining the timing voltage at or above the first voltage level.

8. The light bulb assembly of claim 1, wherein the controller is configured to couple the timing circuit with a comparator, the comparator is configured to compare the timing voltage with a reference voltage, and the comparator is configured to indicate whether the timing voltage is greater or smaller than the reference voltage, thereby providing an indication of the residual level of the timing voltage.

9. The light bulb assembly of claim 1 wherein the driver circuit is configured to provide electrical energy at a drive voltage to a solid state lighting light source and the controller is configured to operate the power converter according to a plurality of different operation states corresponding to a plurality of different illumination states of the light source.

10. The light bulb assembly of claim 9, wherein the controller is configured to operate the power converter according to a current operation state; detect one of a plurality of pre-determined events based on the input voltage; determine a target operation state in accordance to a pre-determined state machine, based on the current operation state and the detected one of the plurality of pre-determined events; and operate the power converter in accordance to the target operation state.

11. The light bulb assembly of claim 10, wherein the plurality of pre-determined events comprises an "off" event and an "off/on", detecting the off event comprises detecting that the residual level of the timing voltage lies below an off-voltage threshold, and detecting the "off/on" event comprises detecting that the residual level of the timing voltage lies above the off-voltage threshold.

12. The light bulb assembly of claim 1 wherein the input voltage corresponds to a rectified mains voltage.

13. The light bulb assembly of claim 1 wherein the driver circuit comprises a supply voltage capacitor coupled to the controller and configured to provide a supply voltage to the controller; the supply voltage capacitor is charged using electrical energy provided at the input of the driver circuit, subsequent to the interruption of electrical energy provided at the input of the driver circuit the supply voltage drops, the controller stops operation if the supply voltage is below a pre-determined supply voltage threshold; and the controller resumes operation if the supply voltage subsequently increases above the pre-determined supply voltage threshold.

14. The light bulb assembly of claim 1 wherein the light source comprises light emitting diodes.

15. The light bulb assembly of claim 14 wherein the light emitting diodes are arranged in strings of light emitting diodes wherein defects of individual light emitting diodes can be either a short circuit or an open circuit.

16. The light bulb assembly of claim 15 wherein the strings of light emitting diodes are connected in parallel.

* * * * *